(12) United States Patent
Gouchi

(10) Patent No.: US 9,484,397 B2
(45) Date of Patent: Nov. 1, 2016

(54) COMPONENT-EMBEDDED SUBSTRATE

(71) Applicant: Murata Manufacturing Co., Ltd., Kyoto-fu (JP)

(72) Inventor: Naoki Gouchi, Kyoto-fu (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 0 days.

(21) Appl. No.: 14/289,938

(22) Filed: May 29, 2014

(65) Prior Publication Data

US 2014/0264737 A1 Sep. 18, 2014

Related U.S. Application Data

(63) Continuation of application No. PCT/JP2013/080253, filed on Nov. 8, 2013.

(30) Foreign Application Priority Data

Dec. 26, 2012 (JP) ................................. 2012-282059

(51) Int. Cl.
*H01L 23/66* (2006.01)
*H01L 49/02* (2006.01)
(Continued)

(52) U.S. Cl.
CPC ............... *H01L 28/10* (2013.01); *H01L 23/66* (2013.01); *H01L 24/18* (2013.01); *H05K 1/186* (2013.01); *H01L 2223/6616* (2013.01);
(Continued)

(58) Field of Classification Search
CPC ....... H01L 23/66; H01L 24/18; H01L 28/10; H01L 2223/6616; H01L 24/19; H01L 24/25; H01L 23/49838; H01L 23/5383; H01L 41/1132; H05K 1/186; H05K 3/4617; H05K 1/0298; H05K 1/183; H05K 1/111; H05K 3/4632; H05K 1/165; G01N 27/128; G01N 27/403; G01N 30/6095
See application file for complete search history.

(56) References Cited

U.S. PATENT DOCUMENTS

| 7,751,202 B2 * | 7/2010 | Seo et al. ....................... 361/795 |
| 2005/0211465 A1 * | 9/2005 | Sunohara ............ H01L 23/5389 174/260 |

(Continued)

FOREIGN PATENT DOCUMENTS

| CN | 101653053 A | 2/2010 |
| CN | 102215637 A | 10/2011 |

(Continued)

OTHER PUBLICATIONS

International Search Report for Application PCT/JP2013/080253 dated Jan. 14, 2014.

(Continued)

*Primary Examiner* — Jarrett Stark
*Assistant Examiner* — Bitew Dinke
(74) *Attorney, Agent, or Firm* — Pearne & Gordon LLP

(57) ABSTRACT

A component-embedded substrate having a multilayer substrate formed by laminating a plurality of thermoplastic sheets in a predetermined direction, an internal component provided in the multilayer substrate, and a surface-mount component mounted on a surface of the multilayer substrate using bumps. The surface-mount component, when viewed in a plan view in the predetermined direction, is positioned so as to cross an outline of the internal component, with the bumps on the surface-mount component located 50 μm or more from the outline of the internal component.

16 Claims, 11 Drawing Sheets

(51) Int. Cl.
*H01L 23/00* (2006.01)
*H05K 1/18* (2006.01)
*H05K 3/46* (2006.01)

(52) U.S. Cl.
CPC ............ *H01L 2223/6672* (2013.01); *H01L 2924/12042* (2013.01); *H05K 3/4617* (2013.01)

(56) References Cited

U.S. PATENT DOCUMENTS

| | | | |
|---|---|---|---|
| 2006/0071337 A1* | 4/2006 | Shi ........................... | C08K 3/36 257/753 |
| 2008/0117608 A1* | 5/2008 | Seo et al. ...................... | 361/761 |
| 2009/0146314 A1* | 6/2009 | Akaike et al. ................ | 257/777 |
| 2009/0174081 A1* | 7/2009 | Furuta ........................... | 257/777 |
| 2009/0188703 A1* | 7/2009 | Ito et al. ...................... | 174/255 |
| 2011/0244636 A1* | 10/2011 | Kondo ........................... | 438/127 |
| 2012/0018877 A1* | 1/2012 | Yang et al. ................... | 257/737 |
| 2012/0188734 A1* | 7/2012 | Mikado et al. ............... | 361/761 |
| 2013/0026622 A1* | 1/2013 | Chuang ................... | H01L 24/11 257/737 |
| 2013/0193593 A1* | 8/2013 | Lin ......................... | H01L 24/13 257/737 |
| 2013/0242517 A1* | 9/2013 | Fujidai et al. ................ | 361/762 |
| 2014/0043196 A1* | 2/2014 | Gouchi et al. ............... | 343/788 |

FOREIGN PATENT DOCUMENTS

| | | |
|---|---|---|
| JP | 2003-007896 A | 1/2003 |
| JP | 2006-310544 A | 11/2006 |
| JP | 2009-164592 A | 7/2009 |
| WO | WO 2011121993 A1 * | 10/2011 |

OTHER PUBLICATIONS

Written Opinion of the International Searching Authority for Application No. PCT/JP2013/080253 dated Jan. 14, 2014.

\* cited by examiner

F I G . 2 D
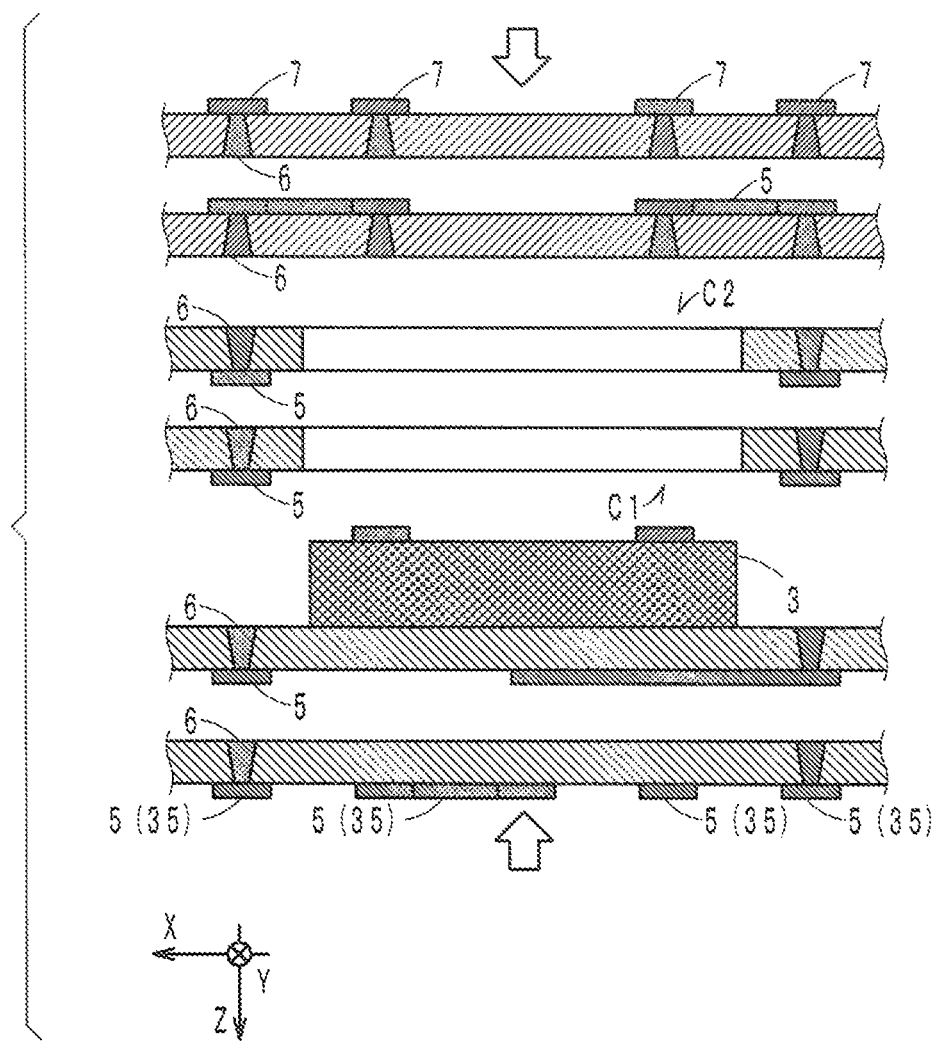

F I G . 3
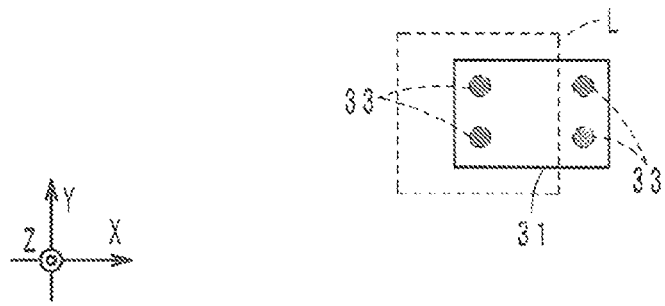
F I G . 4
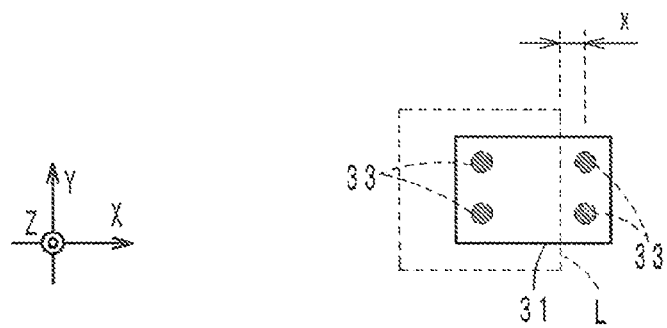
F I G . 5
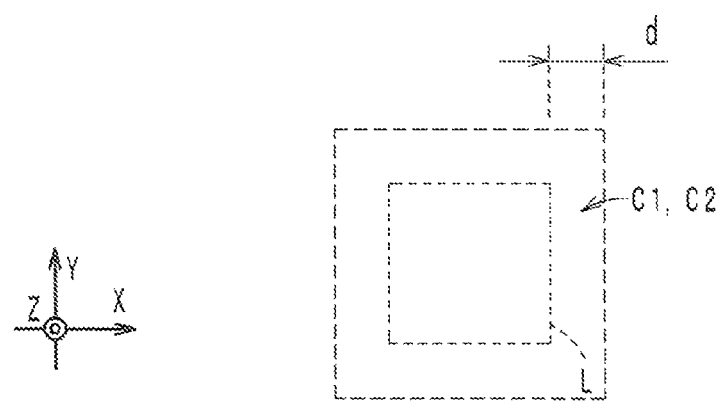

F I G . 6
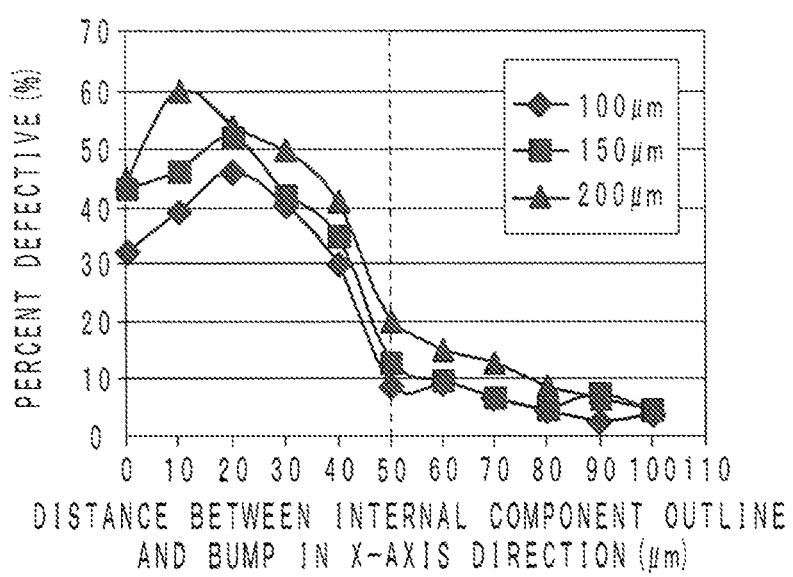

US 9,484,397 B2

COMPONENT-EMBEDDED SUBSTRATE

CROSS-REFERENCE TO RELATED APPLICATIONS

This application is based on Japanese Patent Application No. 2012-282059 filed on Dec. 26, 2012, and International Application No. PCT/JP2013/080253 filed on Nov. 8, 2013, the content of each of which is incorporated herein by reference.

BACKGROUND OF THE INVENTION

1. Field of the Invention

The present invention relates to a component-embedded substrate including internal components, which are embedded in a multilayer substrate made from a thermoplastic material, and surface-mount components provided thereon.

2. Description of Related Art

A conventional component-embedded substrate of this type is described in, for example, Japanese Patent Laid-Open Publication No. 2006-310544. This component-embedded substrate includes a multilayer substrate. Ceramic capacitors are embedded in the multilayer substrate as internal components, and element-mounting areas are defined on the surface (specifically, the top surface) of the multilayer substrate, directly above the internal components. The element-mounting areas are provided so as to be within the outlines of the internal components when they are viewed in a plan view in the direction of lamination. Terminal connecting portions, including conductor patterns, are formed in the element-mounting areas, so that surface-mount components can be provided thereon.

However, providing the element-mounting areas as described above results in difficulty in disposing surface-mount components densely on the surface of a multilayer substrate surface.

BRIEF SUMMARY OF THE INVENTION

A component-embedded substrate according to an embodiment of the present invention includes a multilayer substrate formed by laminating a plurality of thermoplastic sheets in a predetermined direction, an internal component provided in the multilayer substrate, and a surface-mount component mounted on a surface of the multilayer substrate using bumps. The surface-mount component, when viewed in a plan view in the predetermined direction, is positioned so as to cross an outline of the internal component, with the bumps on the surface-mount component located 50 μm or more from the outline of the internal component.

BRIEF DESCRIPTION OF THE DRAWINGS

FIG. 2D is a schematic view illustrating a subsequent step to FIG. 2C;

FIG. 3 is a schematic diagram showing the positional relationship of a surface-mount component on a multilayer substrate;

FIG. 4 is a diagram showing the distance from a side surface of an internal component to a bump in the X-axis direction;

FIG. 5 is a diagram showing the distance from the side surface of the internal component to an edge of a cavity before pressure bonding;

FIG. 6 is a graph showing percent defective versus the distance from the side surface of the internal component to the bump in the X-axis direction;

DETAILED DESCRIPTION OF THE PREFERRED EMBODIMENTS

Preliminary Notes

Figure 1:
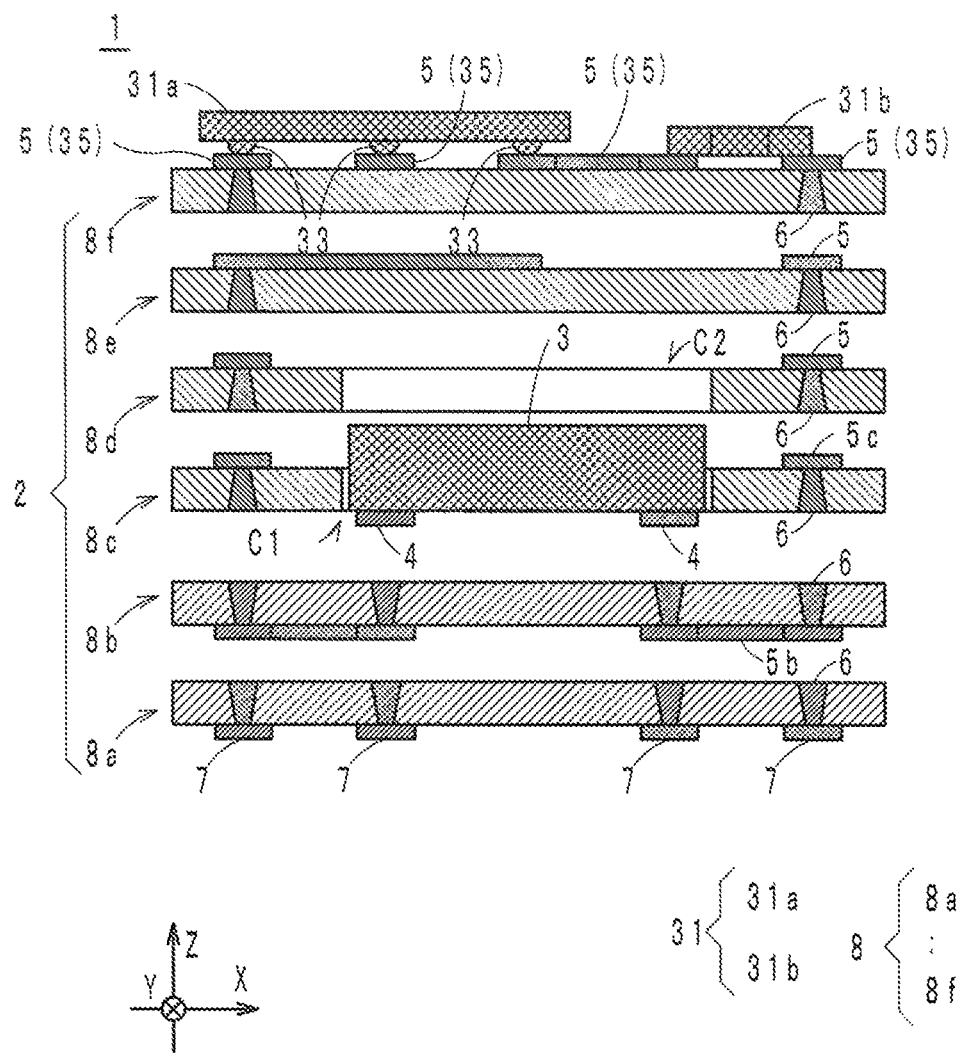
FIG. 1 is a vertical cross-sectional view of a component-embedded substrate according to an embodiment of the present invention.

First, the X-, Y-, and Z-axes in the drawings will be described. The X-, Y-, and Z-axes are perpendicular to one another. The Z-axis represents the direction of lamination of thermoplastic sheets. For the sake of convenience, the positive and negative sides of the Z-axis correspond to the top and bottom sides, respectively. Moreover, the X-axis represents the right-left direction of the thermoplastic sheet. In particular, the positive and negative sides of the X-axis correspond to the left and right sides, respectively. Furthermore, the Y-axis represents the front-rear direction of the thermoplastic sheet. In particular, the positive and negative sides of the Y-axis correspond to the front and rear edges, respectively, of the thermoplastic sheet.

Configuration of Component-Embedded Substrate According to Embodiments

FIG. 1 is a view illustrating in vertical cross section a component-embedded substrate according to a first embodiment of the present invention. In FIG. 1, the component-embedded substrate 1 includes a multilayer substrate 2, at least one internal component 3, a plurality of pattern conductors 5, a plurality of via-conductors 6, and a plurality of external electrodes 7. The component-embedded substrate 1 also includes a plurality of surface-mount type components (referred to below as surface-mount components) 31.

The multilayer substrate 2 is a laminate of thermoplastic sheets 8 (shown in the figure as first through sixth thermoplastic sheets 8a to 8f), and is preferably flexible. The sheets 8a to 8f are made of a flexible material which provides electrical insulation (e.g., thermoplastic resin such as polyimide or liquid crystal polymer). Liquid crystal polymer is preferable as a material of the sheets 8a to 8f because it has superior high-frequency characteristics and exhibits low water absorption. Moreover, the sheets 8a to 8f have the same rectangular shape when they are viewed in a plan view from the positive side of the Z-axis, and the thickness thereof is about 10 to 100 micrometers [μm].

When the component-embedded substrate 1 is mounted on a mothersubstrate (not shown), the sheet 8a is the closest to the mothersubstrate among the sheets 8a to 8f. The external electrodes 7, which are made from a conductive material such as copper, are provided on the bottom surface of the sheet 8a so as to correspond to the positions of land electrodes on the mothersubstrate.

Furthermore, the via-conductors 6 are provided in the sheet 8a. The via-conductors 6 are made of a conductive material such as an alloy of, for example, tin and silver. The via-conductors 6 are formed so as to pierce through the sheet 8a in the Z-axis direction, and are used for electrically connecting an electronic circuit composed of the internal components 3 and the surface-mount components 31 to the land electrodes on the mothersubstrate. Note that only a part of the via-conductors in FIG. 1 are assigned the reference numeral 6 in order not to compromise the clarity of the figure.

The sheet 8b is laminated on the principal surface of the sheet 8a that is located on the positive side in the Z-axis direction. The pattern conductors 5, which are made of a conductive material such as copper, are formed on the principal surface of the sheet 8a that is located on the negative side in the Z-axis direction. The pattern conductors 5 are used for electrically connecting the sheet 8a to external electrodes 4 (to be described later) of the internal component 3, the pattern conductors 5 on the sheet 8c, etc., through at least one via-conductor 6. The sheet 8b also has the same via-conductors 6 as those described above.

The sheets 8c and 8d are laminated on the principal surfaces of the sheets 8b and 8c, respectively, that are located on the positive side in the Z-axis direction. The sheets 8c and 8d have a plurality of pattern conductors 5 provided on their principal surfaces on the positive side in the Z-axis direction, with a view to electrically connecting the surface-mount components 31 to the land electrodes on the mothersubstrate. The sheets 8c and 8d also have the same via-conductors 6 as those described above. Moreover, the sheets 8c and 8d, when viewed in a plan view from the positive side in the Z-axis direction (referred to below as a top view), have respective cavities C1 and C2 to accommodate the internal component 3 to be described later.

The sheet 8e is laminated on the principal surface of the sheet 8d that is located on the positive side in the Z-axis direction, in order to close the opening of the cavity C2. The sheet 8e has pattern conductors 5 provided on the principal surface on the positive side in the Z-axis direction, with a view to electrically connecting the surface-mount components 31 to the land electrodes on the mothersubstrate through via-conductors 6 provided in the sheet 8f. The sheet 8e also has the same via-conductors 6 as those described above.

Furthermore, the sheet 8f is laminated on the principal surface of the sheet 8e that is located on the positive side in the Z-axis direction. The sheet 8f has land electrodes 35 formed on the principal surface on the positive side in the Z-axis direction, and the land electrodes 35 are provided as an example of the pattern conductors 5 to be used for mounting the surface-mount components 31. Moreover, the sheet 8f also has a plurality of via-conductors 6 provided therein, as has already been described. The via-conductors 6 are provided directly below the land electrodes 35 on the sheet 8f, so as to pierce through the sheet 8f in the Z-axis direction.

The internal component 3 is, for example, an antenna coil. Such an antenna coil includes a known structure in which a coil is helically wound on an axis parallel to the X-axis (or the Z-axis) on the surface or inside of a ferrite substrate. Moreover, the internal component 3 also has a plurality of external electrodes 4 provided on the bottom surface. The external electrodes 4 are joined to the via-conductors 6 provided in the sheet 8b and thereby electrically connected to the pattern conductors 5 on the sheet 8b. The internal component 3 is accommodated in the cavities C1 and C2 at the time of production. Accordingly, the cavities C1 and C2 are slightly larger than the internal component 3.

Note that in the present embodiment, the internal component 3 will be described as an antenna coil. However, this is not limiting, and the internal component 3 can be an IC chip or another passive component.

Furthermore, bumps 33 are provided on terminal electrodes on the surfaces of the surface-mount components 31 and used to mount the surface-mount components 31 on the land electrodes 35, which are provided on the principal surface of the multilayer substrate 2 on the positive side in the Z-axis direction. Examples of the surface-mount components 31 illustrated in the present embodiment are an RFIC chip 31a for use in near field communication (NFC) within the 13.56-MHz band, and a chip capacitor 31b, which along with the internal component 3, constitutes a resonant circuit.

The pattern conductors 5 are basically provided in the multilayer substrate 2 and used as wiring conductors. Moreover, in the case where the surface-mount components 31 are mounted on the multilayer substrate 2 as in the present embodiment, pattern conductors 5 are provided on the surface of the multilayer substrate 2 as land electrodes 35. Note that the pattern conductors 5 are limited to neither the wiring conductors nor the land electrodes 35, and can be pattern conductors for use in forming a capacitor or a coil.

The internal component 3 and the surface-mount components 31 as described above are connected by the pattern conductors 5 and the via-conductors 6, thereby forming a predetermined electronic circuit. In the present embodiment, this electronic circuit consists of the RFIC chip 31a and the resonant circuit connected thereto. The resonant circuit consists of the internal component (i.e., the antenna coil) 3 and the chip capacitor 31b, which are connected parallel to the RFIC chip 31a.

Method for Producing Component-Embedded Substrate

Next, the method for producing the component-embedded substrate 1 will be described with reference to FIGS. 2A to 2E. While the following description focuses on the production process for one component-embedded substrate 1, in actuality, large-sized sheets are laminated and cut, so that a number of component-embedded substrates 1 are produced at the same time.

Initially, a necessary number of large-sized sheets are prepared with the surfaces being copper-foiled almost in their entireties. These large-sized sheets are intended for use as the sheets 8 that are to be included in a completed component-embedded substrate 1. In manufacturing a component-embedded substrate 1 as shown in FIG. 1, large-sized sheets 9a to 9f (see FIG. 2A) corresponding to the sheets 8a to 8f are prepared. The sheets 9a to 9f are sheets of liquid crystal polymer having a thickness of about 10 to 100 micrometers [μm]. Moreover, the thickness of the copper foil is, for example, from 6 μm to 35 μm. Note that the copper-foiled surfaces are preferably smoothened, for example, by galvanization for rust prevention.

Figure 2A:
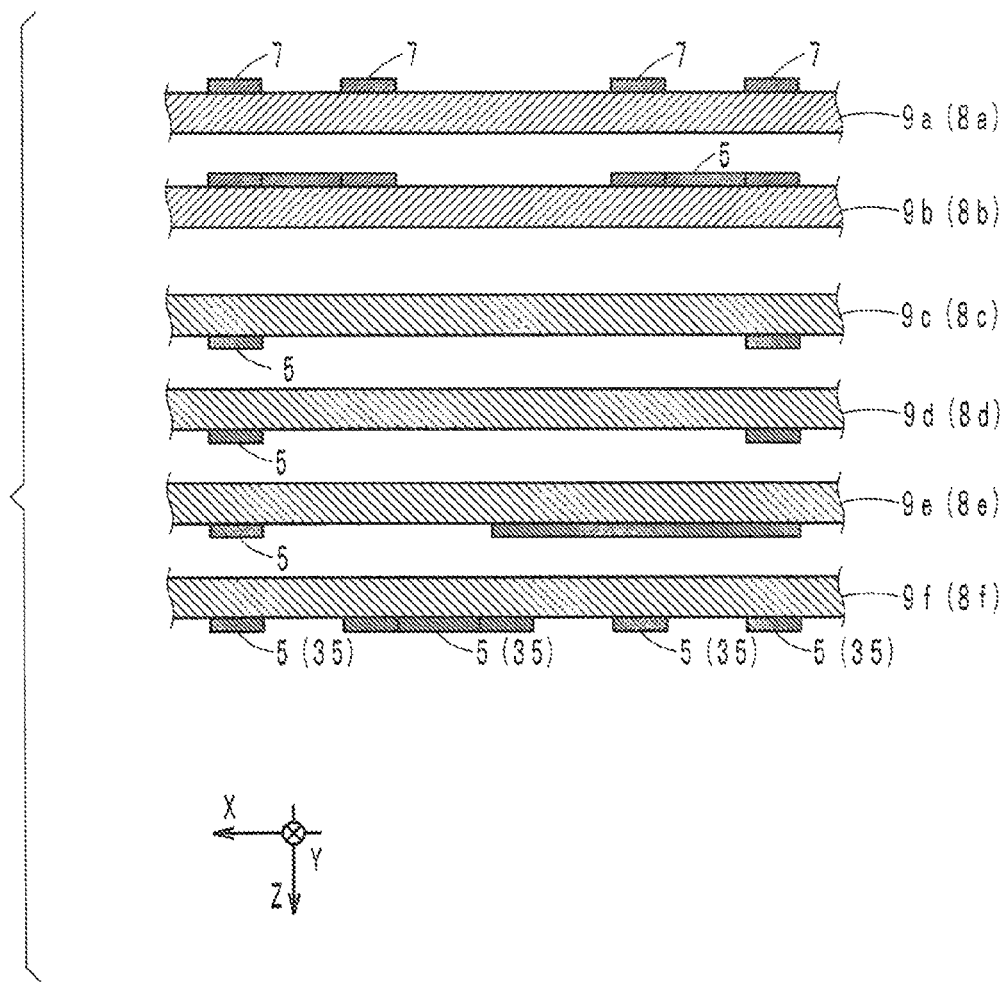
FIG. 2A is a schematic view illustrating the first step of a method for producing the component-embedded substrate in FIG. 1.

Next, unnecessary copper foil is removed by photolithography, so that a plurality of external electrodes 7 are formed on one side (e.g., the bottom surface) of at least the sheet 9a, as shown in FIG. 2A. Similarly, pattern conductors 5 are formed on one side (e.g., the bottom surface) of the sheet 9b. Similarly, pattern conductors 5 are also formed on one side (e.g., the principle surface on the positive side in the Z-axis direction) of each of the large-sized sheets 9c to 9f.

Figure 2B:
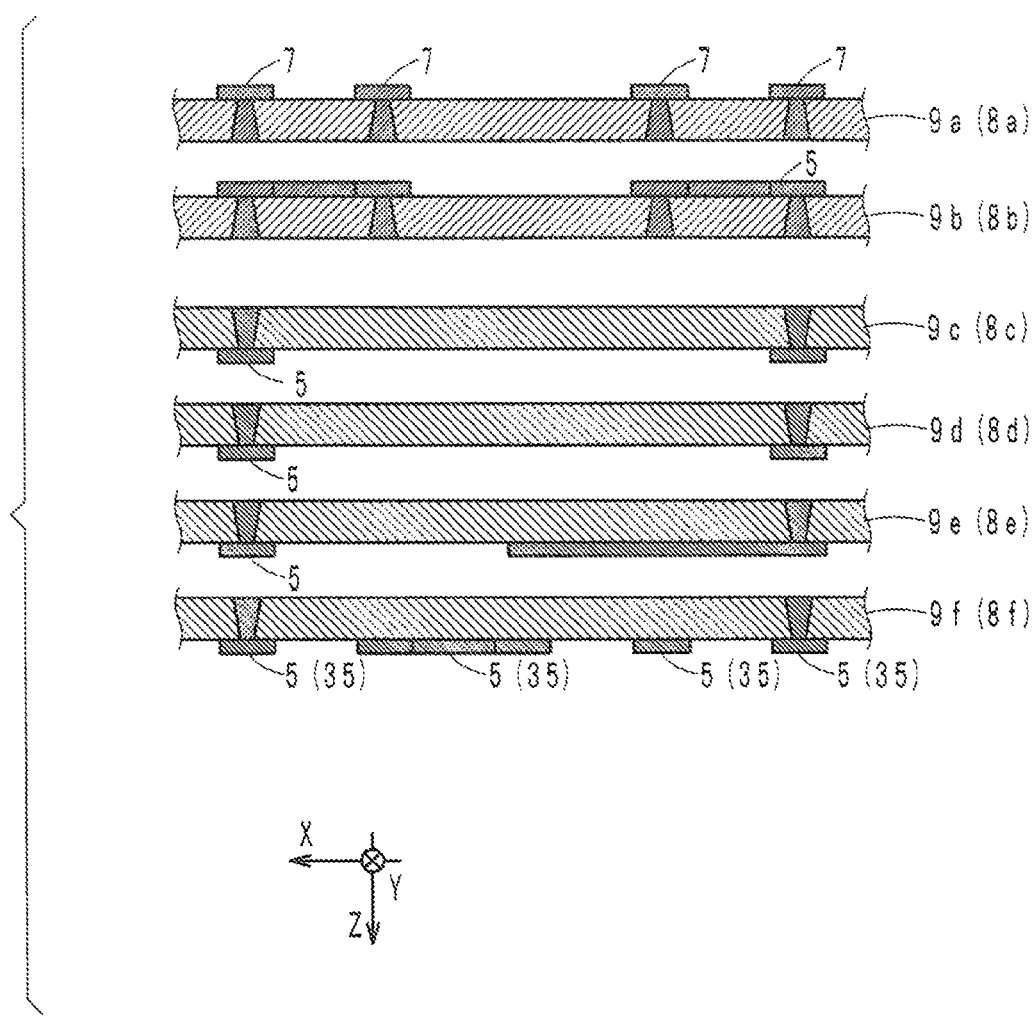
FIG. 2B is a schematic view illustrating a subsequent step to FIG. 2A.

Next, the sheet 9a is irradiated with laser beams where via-conductors 6 are to be formed, from the side without the external electrodes 7, as shown in FIG. 2B. As a result, through-holes are provided in the sheet 9a without making holes into the external electrodes 7, and thereafter, each through-hole is filled with a conductive paste.

Furthermore, the sheet 9b is irradiated with laser beams where via-conductors 6 are to be formed, from the side without the pattern conductors 5. The resultant through-holes are filled with a conductive paste. Similarly, through-holes are also provided at predetermined positions in the sheets 9c to 9f, and filled with a conductive paste.

Figure 2C:
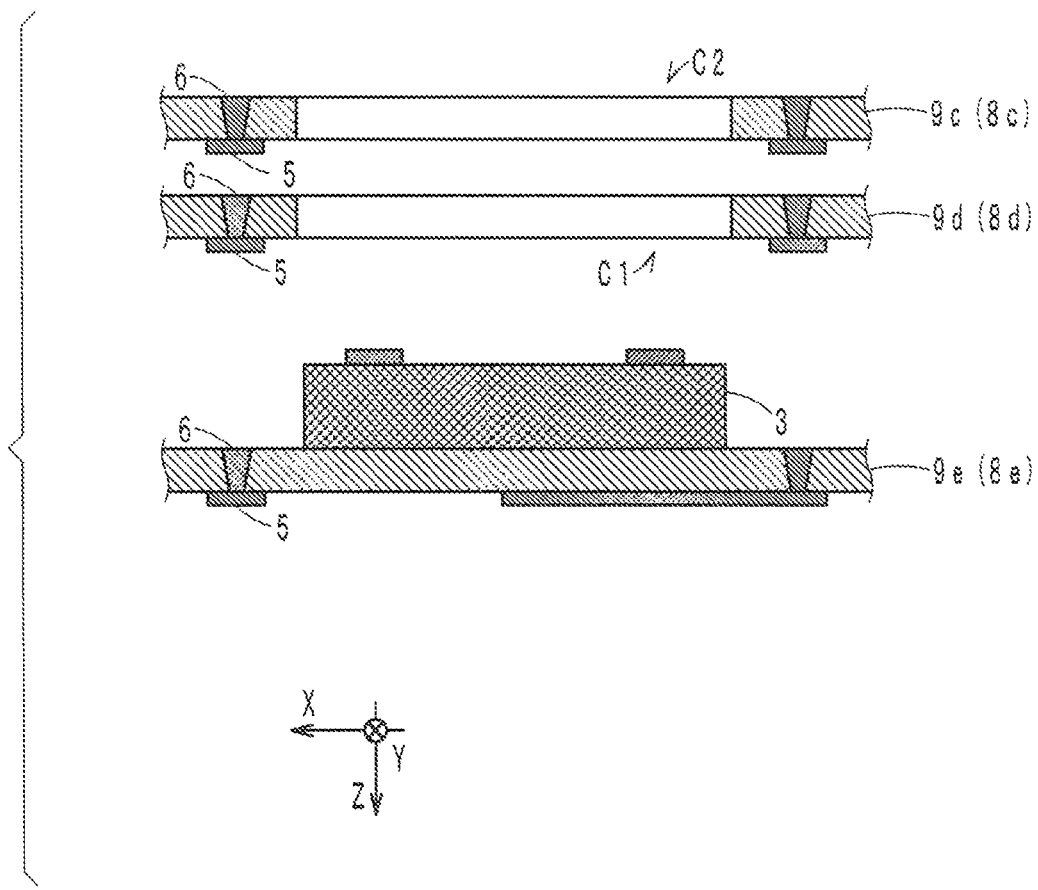
FIG. 2C is a schematic view illustrating a subsequent step to FIG. 2B.

Next, an internal component 3 is placed in position on the surface of the sheet 9e on which the pattern conductors 5 are not formed, as shown in FIG. 2C. Moreover, through-holes C1 are C2 are provided in predetermined areas of the sheets 9c and 9d by punching with a die. Note that the positioning of the internal component 3 may be performed using the through-holes C1 and C2. In such a case, the internal component 3 is inserted into the through-holes C1 and C2.

Next, the sheets 9a to 9f are stacked in this order from bottom to top, as shown in FIG. 2D. Here, the sheet 9a is placed such that the surface with the external electrodes 7 faces the negative side in the Z-axis direction, and the sheet 9b is stacked thereon such that the surface with the pattern conductors 5 faces the negative side in the Z-axis direction. Moreover, the sheets 9c to 9f are stacked such that their surfaces with the pattern conductors 5 face the positive side in the Z-axis direction.

Thereafter, the stacked sheets 9a to 9f are heated and pressed from both sides of the Z-axis direction. The heating and pressing softens the sheets 9a to 9f so as to be bonded and integrated. At the same time, the conductive pastes in the via-holes is solidified so that via-conductors 6 are formed.

Figure 2E:
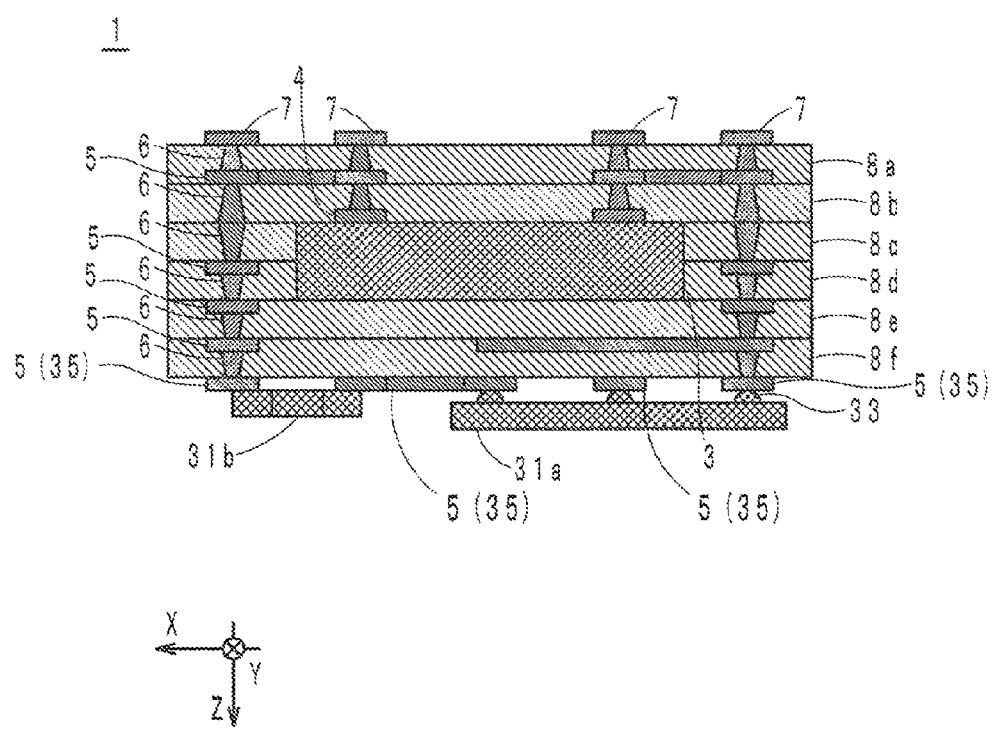
FIG. 2E is a vertical cross-sectional view illustrating a completed component-embedded substrate.

Furthermore, by reflow soldering or suchlike, the surface-mount component 31 is mounted with bumps 33 joined to land electrodes 35 of the sheet 9f, and thereafter, the integrated sheets 9a to 9f are cut into a predetermined size, so that a component-embedded substrate 1 is completed, as shown in FIG. 2E.

Mountability of Surface-Mounted Component

In the case where the surface-mount component 31 is mounted on the multilayer substrate 2 using the bumps 33, the mountability thereof is affected by the smoothness of the multilayer substrate 2 directly below the bumps 33. Here, there is a possibility that the multilayer substrate 2 might develop plasticity because of heat after bonding by reflow soldering or suchlike.

Furthermore, the present inventors studied the case where the internal component 3 is included in the multilayer substrate 2, and made findings (1) and (2) below.

(1) In some cases, the cavities C1 and C2 cause insufficient filling of thermoplastic resin near the side surfaces of the internal component 3 (more specifically, the side surfaces are approximately parallel to the Z-axis).

(2) The thermoplastic resin readily slips along the side surfaces of the internal component 3 in the Z-axis direction.

Here, if the surface-mount component 31 is disposed such that the bumps 33 of the surface-mount component 31 overlap the outline of the internal component 3 when they are viewed in a top view, the weight of the surface-mount component 31 is applied to the portions directly below the bumps 33, and since the filling with thermoplastic resin is insufficient near the side surfaces of the internal component 3, and the thermoplastic resin readily slips along the side surfaces of the internal component 3 in the Z-axis direction, the portions directly below the bumps 33 and their neighboring portions are readily depressed, causing the surface-mount component 31 to be susceptible to defective joints and poor mounting.

Therefore, in the case of the component-embedded substrate 1, first of all, to densely mount a plurality of surface-mount components 31 in the space on the surface of the multilayer substrate 2, the surface-mount component 31, when viewed in a top view, is disposed so as to cross the outline L of the internal component 3, rather than lie within the outline L, as shown in FIG. 3. More specifically, the surface-mount component 31, when viewed in a top view, is disposed so as to lie both inside and outside of the internal component 3 beyond the outline L. In addition, it was discovered that defective joints can be reduced by disposing the surface-mount component 31 such that the bumps 33, when viewed in a top view, are not positioned on the outline L of the internal component 3, as shown in FIG. 3, and are located 50 μm from the outline L.

To verify the effect achieved by placing the surface-mount component 31 as described above, the present inventors conducted measurements as follows. Specifically, percent defective was measured for the distance x from the side surface of the internal component 3 (the outline L) to the center of bump 33 in the X-axis direction (see FIG. 4). Here, in the case where x is 0, the bump 33, when viewed in a top view, is located on the outline L of the internal component 3. Moreover, the measurements were conducted under the conditions where the distance d between the side surface of the internal component 3 before bonding and the edge of the cavity C1 or C2 (see FIG. 5) was 100 μm, 150 μm, or 200 μm. The measurement results are shown in FIG. 6. In FIG. 6, solid rhombuses represent percent defective where d=100 μm, solid rectangles represent percent defective where d=150 μm, and solid triangles represent percent defective where d=200 μm. From the measurement results, it can be appreciated that regardless of the value of d, percent defective drops sharply to about 20% or less where the bump 33 is located 50 μm from the outline L of the internal component 3.

Figure 7A:
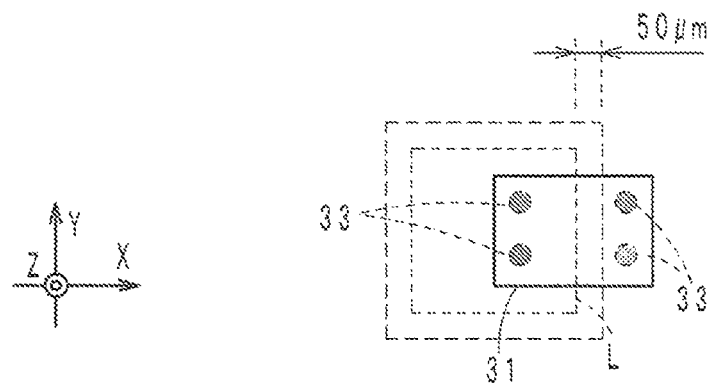
FIG. 7A is a plan view illustrating a first example where the surface-mount component crosses an outline, with the bump located 50 μm or more from the outline.
Figure 7B:
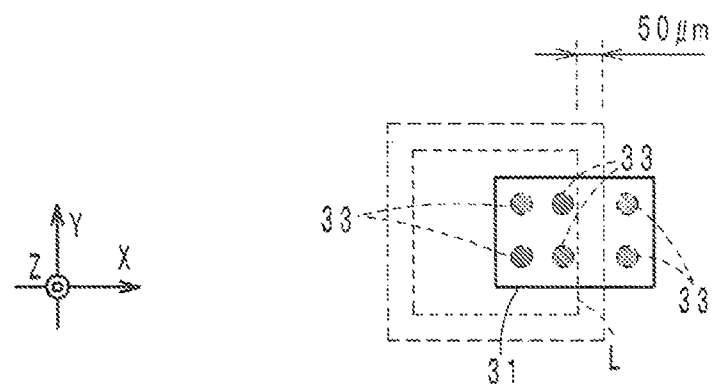
FIG. 7B is a plan view illustrating a second example where the surface-mount component crosses the outline, with the bump located 50 μm or more from the outline.
Figure 7C:
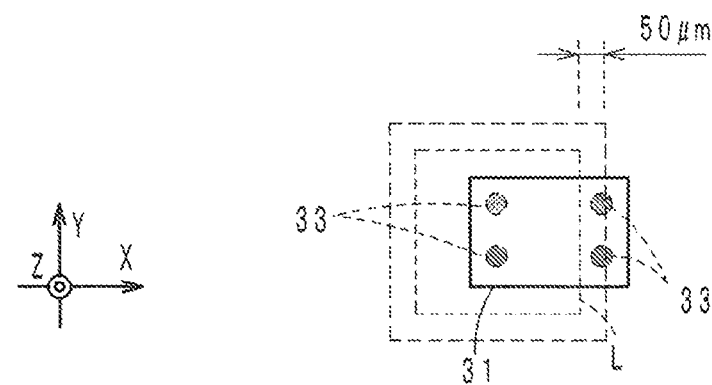
FIG. 7C is a plan view illustrating a first example where the surface-mount component crosses the outline, with the bump located less than 50 μm from the outline.
Figure 7D:
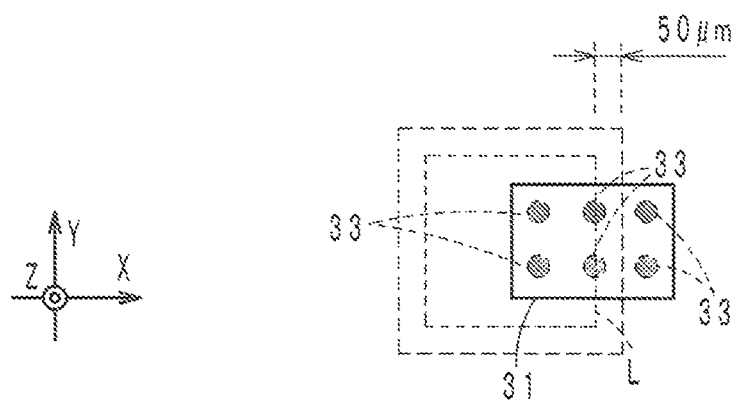
FIG. 7D is a plan view illustrating a second example where the surface-mount component crosses the outline, with the bump located less than 50 μm from the outline.

Here, FIGS. 7A and 7B illustrate examples where the surface-mount component 31, when viewed in a top view, crosses the outline L of the internal component 3, with the bumps 33 located 50 μm or more from the outline L, and in these cases, it is possible to effectively use the space on the surface of the multilayer substrate 2 and also reduce defective joints. On the other hand, FIGS. 7C and 7D illustrate examples where the surface-mount component 31, when viewed in a top view, crosses the outline L of the internal component 3, with the bumps 33 located less than 50 μm from the outline L. In these cases, the aforementioned technical effects cannot be achieved.

Modification

Figure 8:
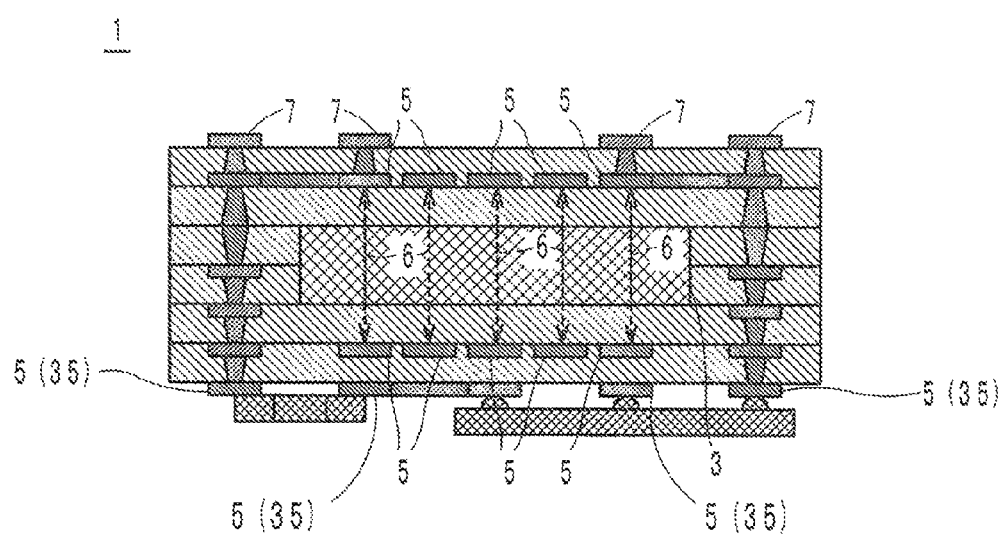
FIG. 8 is a vertical cross-sectional view of a component-embedded substrate according to a modification.

The internal component 3 in the example of FIG. 1 has been described as an antenna coil. However, this is not limiting, and the internal component 3 may simply be a piece of ferrite around which a coil is formed by pattern conductors 5 and via-conductors 6, as shown in FIG. 8. Note that in FIG. 8, the via-conductors 6 are indicated by dotted arrows for convenience of illustration.

Although the present invention has been described in connection with the preferred embodiment above, it is to be noted that various changes and modifications are possible to those who are skilled in the art. Such changes and modifications are to be understood as being within the scope of the invention.

What is claimed is:

1. A component-embedded substrate comprising:
a multilayer substrate formed by laminating a plurality of thermoplastic sheets in a predetermined direction;
an internal component provided in the multilayer substrate; and
a surface-mount component mounted on a surface of the multilayer substrate using bumps, wherein,
the surface-mount component, when viewed in a plan view in the predetermined direction, is positioned so as to cross an outline of the internal component, and all of the bumps on the surface-mount component have a center located 50 µm or more from the outline of the internal component.

2. The component-embedded substrate according to claim 1, wherein the thermoplastic sheets are made from liquid crystal polymer.

3. The component-embedded substrate according to claim 1, wherein the internal component comprises an antenna coil.

4. The component-embedded substrate according to claim 1, wherein the surface-mount component comprises an RFIC chip.

5. The component-embedded substrate according to claim 1, wherein each of the thermoplastic sheets includes at least one via-conductor through the thermoplastic sheet.

6. The component-embedded substrate according to claim 1, further comprising a capacitor, wherein:
the internal component comprises an antenna coil,
the surface-mount component comprises an RFIC chip, and
the antenna coil, the capacitor, and the RFIC chip are configured to form a resonant circuit.

7. The component-embedded substrate according to claim 1, wherein the internal component comprises a ferrite portion, and a coil is formed within the multilayer substrate around the ferrite portion.

8. The component-embedded substrate according to claim 7, wherein the coil is formed by pattern conductors and via-conductors within the multilayer substrate.

9. A component-embedded substrate comprising:
a multilayer substrate formed by laminating a plurality of thermoplastic sheets in a predetermined direction;
an internal component provided in the multilayer substrate;
a surface-mount component; and
means for mounting the surface-mount component on a surface of the multilayer substrate, wherein,
the surface-mount component, when viewed in a plan view in the predetermined direction, is positioned so as to cross an outline of the internal component, and all of the means for mounting the surface-mount component have a center located 50 µm or more from the outline of the internal component.

10. The component-embedded substrate according to claim 9, wherein the thermoplastic sheets are made from liquid crystal polymer.

11. The component-embedded substrate according to claim 9, wherein the internal component comprises an antenna coil.

12. The component-embedded substrate according to claim 9, wherein the surface-mount component comprises an RFIC chip.

13. The component-embedded substrate according to claim 9, wherein each of the thermoplastic sheets includes at least one via-conductor through the thermoplastic sheet.

14. The component-embedded substrate according to claim 9, further comprising a capacitor, wherein:
the internal component comprises an antenna coil,
the surface-mount component comprises an RFIC chip, and
the antenna coil, the capacitor, and the RFIC chip are configured to form a resonant circuit.

15. The component-embedded substrate according to claim 9, wherein the internal component comprises a ferrite portion, and a coil is formed within the multilayer substrate around the ferrite portion.

16. The component-embedded substrate according to claim 15, wherein the coil is formed by pattern conductors and via-conductors within the multilayer substrate.

* * * * *